(12) United States Patent
Marten

(10) Patent No.: US 9,588,144 B2
(45) Date of Patent: Mar. 7, 2017

(54) CURRENT SENSOR

(71) Applicant: Sendyne Corporation, New York, NY (US)

(72) Inventor: Victor Marten, Flushing, NY (US)

(73) Assignee: Sendyne Corporation, New York, NY (US)

( * ) Notice: Subject to any disclaimer, the term of this patent is extended or adjusted under 35 U.S.C. 154(b) by 0 days.

(21) Appl. No.: 14/696,384

(22) Filed: Apr. 25, 2015

(65) Prior Publication Data

US 2015/0268277 A1    Sep. 24, 2015

Related U.S. Application Data

(63) Continuation of application No. 14/540,025, filed on Nov. 12, 2014, now Pat. No. 9,052,343, which is a continuation of application No. 13/580,377, filed as application No. PCT/IB2011/055535 on Dec. 7, 2011, now abandoned.

(60) Provisional application No. 61/553,893, filed on Oct. 31, 2011, provisional application No. 61/448,179, filed on Mar. 1, 2011.

(51) Int. Cl.
| G01R 1/20 | (2006.01) |
| G01R 1/30 | (2006.01) |
| G01R 29/24 | (2006.01) |
| G01R 35/00 | (2006.01) |
| G01R 15/14 | (2006.01) |
| G01R 19/00 | (2006.01) |

(52) U.S. Cl.
CPC ............... *G01R 1/203* (2013.01); *G01R 1/30* (2013.01); *G01R 15/146* (2013.01); *G01R 19/0092* (2013.01); *G01R 29/24* (2013.01); *G01R 35/005* (2013.01); *G01R 19/0023* (2013.01)

(58) Field of Classification Search
CPC ................................. G01R 1/203; G01R 1/30
USPC ........................................................ 324/713
See application file for complete search history.

(56) References Cited

U.S. PATENT DOCUMENTS

| 4,499,424 A * | 2/1985 | Rowlette ............ G01R 31/3665 324/427 |
| 4,974,679 A * | 12/1990 | Reuter .................... G01D 3/022 177/185 |
| 6,617,838 B1 * | 9/2003 | Miranda ............ G01R 19/0092 324/117 R |
| 2003/0025514 A1 * | 2/2003 | Benes .................... G01R 15/09 324/713 |

\* cited by examiner

*Primary Examiner* — Thomas Valone
(74) *Attorney, Agent, or Firm* — Oppedahl Patent Law Firm LLC

(57) ABSTRACT

An apparatus and method make use of a single shunt and two or more instrumentation amplifiers, switchably measuring voltages at the shunt. This permits current measurement. At times each instrumentation amplifier has its input shorted, which permits zeroing out many sources of offset in the signal path of that amplifier. Dynamic range is several orders of magnitude better than known current measurement approaches, permitting coulometry.

21 Claims, 5 Drawing Sheets

CURRENT SENSOR

Application Ser. No. 13/580,377 filed Dec. 7, 2011 is incorporated herein by reference for all purposes.

BACKGROUND

It is not easy to measure the flow of electricity accurately over a wide dynamic range while dissipating very little waste heat.

Whenever electrical energy is used, it is desirable to measure the quantity of energy used, both per unit of time (e.g. power), and over a specific amount of time (for example, energy used per month). In a residential environment, an electric power meter is a familiar fixture; it allows the power-providing companies to charge their customers for the energy used.

In the most basic terms, the instantaneous power is a product of the voltage applied to, and the current flowing through, the load. An integration of this product (power) over a specific time interval yields the total consumption of the electrical energy within that time interval.

Accurate measurement of the load current is thus an important part of the apparatus that measure the consumption of electrical energy.

It will be helpful to review the present state of the art in current measurements, considering numerous examples of the devices capable of current measurement. In broad terms, they all fall into two categories, namely:
  direct measurement of the current as manifested by a voltage drop across a sense resistor (oftentimes called a resistive shunt), and
  indirect measurement of the flowing current by assessment of the magnetic field that is created around the conducting wire that is carrying the current.

Current-measuring apparatus further differ in their ability to measure DC (direct current) or AC (alternating current), and also differ in the total range of frequencies that can be processed with a high degree of accuracy. The apparatus that can accommodate large currents also differ in their ability to measure small currents accurately.

Typical current sensors in industrial, commercial, and household environments furnish the AC measurements; the parameter of interest is usually the peak-to-peak or Root-Mean-Square (RMS) value of the current, averaged across at least a single cycle of the AC frequency; in such measurements the DC component of the current is assumed to be exactly zero. The ultimate use of these measurements is for an overall consumption of energy, and the sensor is made to be quite accurate when a large level of current is flowing. Errors resulting from inadequate precision of measurements for small levels of current are simply ignored, as they contribute only minimally to the total energy assessment. Stated differently, when one is measuring large currents to assess overall energy consumptions, one does not mind that small currents are not measured accurately.

A moment's reflection, however, will reveal that for operations with DC power, and specifically for DC-power systems that use a battery, the current measurement needs are quite different. It is not uncommon for a DC-supplied system to spend most of its time operating at a very low power level, and to consume the full-rated energy only for relatively brief intervals. In such a system, the current-sensing apparatus must be able to faithfully measure the current across widely different levels, while at the same time maintaining at most a very small DC offset error. In many DC power systems that use a battery, it is desired to monitor the SOC (state of charge) of the battery which requires continuous and uninterrupted current measurements so that integrations may be carried out, making coulometry possible.

Several contradictory constraints apply to such a current sensor, for example:
  The output signal should accurately represent the measured current. In technical terms, the sensitivity or conversion gain between the measured current and output signal should be accurate and stable.
  The readings for times when no current is flowing should be as close as possible to zero. In technical terms, the systematic offset of the measurement should be zero.
  The output signal should be available continuously, with quick response time to the changes in the measured current.
  The current sensor should be insensitive to interfering RF (radio frequency) and EM (electromagnetic) fields, because such fields are naturally present in any environment where electrical energy is used, and are typically generated by the very same apparatus that use the electric energy. This requirement usually dictates the use of so-called RFI (RF interference) filtering, in order to prevent the interfering signals from affecting the measurements.
  The power dissipation in the sensing element should be minimal.
  The energy consumed by the current measurement circuit should be small; this has an increased importance for a system that a operates from a battery, and the actual goal of making the current measurements is for reduction of the energy consumption and/or estimation of the remaining energy in the battery. Having said this, in many applications it is acceptable to permit the energy used in the current measurement circuit to increase somewhat when large currents are flowing, that is, when large amounts of energy are being consumed. In other words, it is desirable to have low energy consumption in relative terms, where the power consumption of the measurement circuit will not appreciably affect the total energy value.

The most common method of current sensing is to pass the current through a resistor (a current shunt) and to measure the resulting voltage drop, which develops according to Ohm's law. A current sensor circuit based on this principle is illustrated in FIG. 1. input terminals 1 allow connection of the current shunt 2 into the circuit where current is to be measured. Instrumentation amplifier (IA) 6 senses voltage across the current shunt 2, and provides (voltage) output on terminals 10. Pick-up points 3 on the current shunt 2 are located following the principle of "Kelvin sensing" that reduces errors associated with resistance of the sense connections and wires. With such an arrangement, the conductors that do the sensing have almost no current, and so there is very little IR (current times resistance) drop in those conductors. RFI filter 4 is utilized for reduction of effects due to interfering RF signals from surrounding machinery and environment. This part of the circuit may have various configurations, and may consist of resistive, capacitive, and inductive components, as well as semiconductor transient protectors. The particular configuration 4 shown in FIG. 1 is exemplary but there are many possible arrangements which might be employed.

FIG. 1 shows an instrumentation amplifier 6 modeled as containing an ideal amplifier 7. The ideal amplifier 7 is imagined to have infinite input impedance, zero output impedance, linear gain, and zero offsets or drift, all across some defined dynamic range of inputs and from DC to at least some frequency defining some frequency response. Also shown in FIG. 1 are modeled sources of error 5, 8, and 9 that make the performance less than ideal when compared to the requirements above. The modeled voltage sensing error sources 5 appear in series with the proper signal, and introduce unpredictable offset errors at the inputs of the IA 6. These errors can be further modeled as illustrated in FIG. 2.

Turning to FIG. 2, items comprising a string of dissimilar materials 13, 14, 15, 17, 18, and 20 are joined by solder 16. Exemplary items may be a Kelvin connection lead 13 from the current shunt 2, a surface-mount component 15 such as a resistor, an IC (integrated circuit) lead 17, a lead-to-die bonding wire 18, and IC die metallizations 20 at the IC die 19. A printed circuit (PC) board 12 is composed in part of a substrate material such as FR-4. A modeled temperature gradient 21 is shown, with a higher temperature at one end of this string and a lower temperature at the other end of this string. As mentioned below, anisotropies and inhomogeneities of temperature may easily develop to be more complicated than a mere gradient as shown in FIG. 2. As will be discussed below in connection with the invention, approaches discussed below have some prospect of measuring and correcting errors due to temperature variations that are more complicated than mere gradients.

The materials depicted in FIG. 2 make up the connections between the current shunt 2 and the actual input terminals of the IA 6 (which are part of the die metallization 20). Redrawn in a more recognizable form at the lower part of FIG. 2, it will be appreciated that these connections are in fact thermocouples, each capable of producing a voltage when a temperature difference (temperature gradient 21) exists between the extremes of the circuit at points 13 and 20, or inside of the string of the serially connected elements. This error voltage could potentially be on the order of several millivolts (mV). The most common temperature-induced errors may be because of gradients between 13 and 20, but as will be appreciated, any anisotropies or inhomogeneities in temperature can likewise give rise to error voltages.

Returning to FIG. 1, the error source 8 is a modeled offset error in the IA 6, and the error source 9 is a modeled noise error in the IA 6.

As will be appreciated, the circuit is designed utilizing differential signals, and the designer will hope that this will compensate most of the thermocouple-induced errors, because such errors are to some extent common-mode in nature (affecting each line of the two differential inputs in somewhat the same way). But any non-identical temperature distributions as between the two paths can give rise to errors which are not automatically compensated by the use of differential sensing.

Because there are error sources 5 in the differential sensing lines, the designer of a system such as is depicted in FIG. 1 will often not go to the trouble to select a module or integrated circuit for IA 6 that has a particularly low offset voltage 8.

The circuits similar to FIG. 1, or derivatives thereof, are generally used for measuring currents up to perhaps 10 A (Amperes). The designer of the current sensing system will typically select a shunt value such that the voltage drop across the sensing resistor 2 is 100 mV or more, so that this voltage will swamp or overwhelm the error sources just described. For any given maximum rated current (that is, for some particular real-life application) the resistance of the shunt 2 will be chosen so that the voltage developed across it is within some range of voltages. This leads to a situation where the heat dissipated in the sense resistor 2 grows at least linearly with the rated maximum current for which the particular circuit is being designed.

The physical size of the sense resistor 2 can thus get to be a problem, as can be the need to providing adequate cooling of the sense resistor. For this reason, for higher currents a different class of current sensing devices is used, typically utilizing an indirect method of current sensing by assessment of the magnetic field that is created around the conducting wire which is carrying the current.

The so-called Hall-effect apparatus is common for current measurements in excess of several Amperes. A Hall-effect device is able to produce a (differential) voltage signal when a continuous (supply) current is sent through the device, and a magnetic field is present that is perpendicular to the flow of that supply current. The voltage signal in the Hall-effect device is linearly proportional to both the supply current and the magnetic field, within limitations of power dissipation resulting from the supply current, and some additional anomalous effects. The current that needs to be measured generates the magnetic field acting on the device.

The sensitivity of the Hall-effect device to the magnetic field depends, among many things, for example upon mechanical dimensions of the sensing element, material composition and uniformity, attachment of the electrodes, stability and accuracy of the supply current, and construction of the magnetic core that concentrates the desired magnetic field and rejects interfering magnetic fields (of which the Earth's magnetic field is just a single example).

Typically every single manufactured Hall-effect device would need an individual calibration in order to ascertain the actual device sensitivity (which further depends on the particular circuit arrangement and on the design of the magnetic path elements).

The native offset of the unaided Hall-effect device is nonzero. For this reason various auto-zeroing schemes have been utilized in the prior art. One approach is to arrange for the supply current to the sensing element to be AC rather than DC. Within such an approach, differing schemes make use of various shapes or waveforms of the AC current, for example sine waves or square waves or even more complex shapes. The AC signal that is the output of the Hall-effect sensing element is further processed by a synchronous detector.

In a system where the Hall-effect sensor is employed and where the current sensed is AC, it usually turns out to be necessary to average or filter the sensed signal over several cycles of the AC excitation. This means that there is always some latency between a current event of interest and the detection of such an event after the averaging or filtering has taken place. The latency cannot be reduced to zero.

A further potential difficulty with such magnetically coupled measurements (particularly where a DC current is converted to AC for purposes of Hall-effect sensing) is that during the zero crossings of the excitation voltage (that is, near the zero values for the sine-wave excitation), the Hall-effect device is altogether insensitive to the magnetic field, and simply discards any information for the duration of the zero-crossing transitions.

Yet another variation of the Hall-effect devices makes use of an active feedback loop that tries to zero-out the total magnetic field acting on the sensing element, thus reducing possible non-linearities in the sensing element (since in this case, the Hall-effect sensing element only needs to indicate if the magnetic field is smaller or higher than zero, and does not need to supply the actual value). A winding on the magnetic path elements creates a magnetic field that is opposite to the field from the measured current. The opposing winding is normally constructed with many turns (typically, with several thousands of turns), so as to minimize the current that needs to be injected into the winding in order to zero out the total magnetic field. The servo loop that drives the zeroing-out winding will of course take some nonzero time to settle and to respond to perturbations.

It will be appreciated that in addition to slow time response, the Hall-effect devices utilizing the active feedback will require additional operating energy in order to supply the feedback circuitry and winding. These factors make the Hall effect sensing less than ideal, particularly for a battery-powered system.

Other current measurement approaches have been devised that indirectly sense current by assessment of the magnetic field that is created around the conducting wire that is carrying the current. These are based on a so-called magnetoresistance (MR) effect, including variations called Giant Magnetoresistance (GMR) and Colossal Magnetoresistance (CMR). These devices rely on resistance changes within the sensing material due to the magnetic field to which the sensing material is subjected.

The error sources mentioned above with respect to shunt-type current measurements present themselves, mutatis mutandis, with the Hall-effect sensing approaches just discussed, and also present themselves with the apparatus based on the MR-effect. For the MR-effect approaches, the notably worst performance is in respect to the zero-current offset for the MR-effect based measurements.

It would be very desirable if approaches could be found for current measurement, particularly DC measurement, which would be accurate at low currents as well as high currents, and which would be continuously available. It would be desirable if most offset error sources could be zeroed out, leading to measurements accurate enough for coulometry. It would be desirable if the approaches could dissipate very little waste heat in the sensing apparatus, and if the measurements could simultaneously:

be low enough in latency to permit a quick-response electronic "fuse" capability, and yet be sufficiently filtered against RFI so as to permit filtering out such interference.

It would further be desirable if some or all of these results could be achieved economically, without the need for unnecessarily expensive parts such as unnecessarily expensive semiconductor switches and the like.

SUMMARY OF THE INVENTION

An apparatus and method make use of a single shunt and two or more instrumentation amplifiers, switchably measuring voltages at the shunt. Dynamic range is several orders of magnitude better than known current measurement approaches, permitting coulometry.

The current invention teaches a circuit and an algorithm (for the control part of the circuit, and for combined operations of the analog and digital parts of the circuit).

This circuit and the algorithm empower the creation of a current sensor that is accurate at much larger range of measured currents than in the prior art; it provides several-orders-of-magnitude dynamic range improvement. Compared with the prior-art implementations, the current invention reduces the waste of energy in the sensing element to near zero. The energy consumption of the circuit itself can be reduced to near zero levels under conditions of low reporting rates for the measured current and/or accumulated charge. Due to very low measurement offset for the DC current, an accumulated charge value is quite accurate, even under conditions of a load current that is many times smaller than the maximum rated load current.

The high accuracy of the current sensor is ensured due to continuous assessment of most of the interfering voltage errors, and subtracting these errors from the actual measured value.

The output of the circuit according to the current invention is continuous, if such an operating mode is desired; this is in spite of the fact that all circuits in the sensor alternate between the actual measurement and the calibration functionality (in order to measure and zero-out the errors).

The ability to provide a continuous output is important if fast-acting electronic fuse functionality is desired. The ability to provide a continuous output is important as well if it is desired to integrate the measured current so as to achieve coulometry.

The actual frequency, with which the calibration cycles are performed, can be fixed or it can depend on the changes in the temperature or temperature gradients that are the dominant causes of the errors. In other words, the calibration cycles can be performed more frequently if the temperatures and/or temperature gradients change rapidly.

DESCRIPTION OF THE DRAWING

The invention will be described with respect to a drawing in several figures, of which.

DETAILED DESCRIPTION

Figure 1:
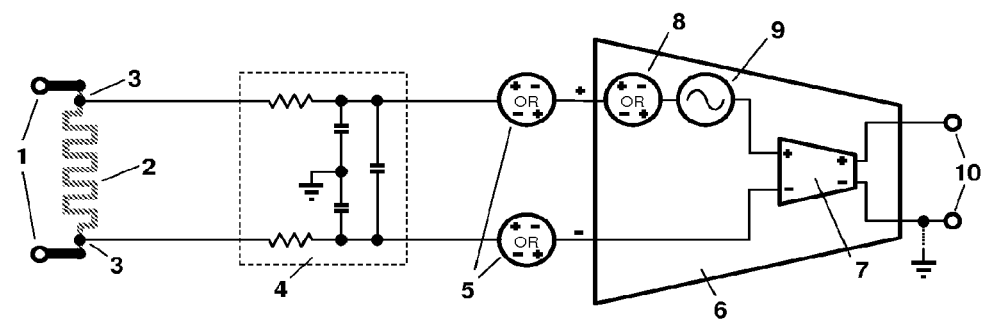
FIG. 1 depicts the prior art circuit.
Figure 2:
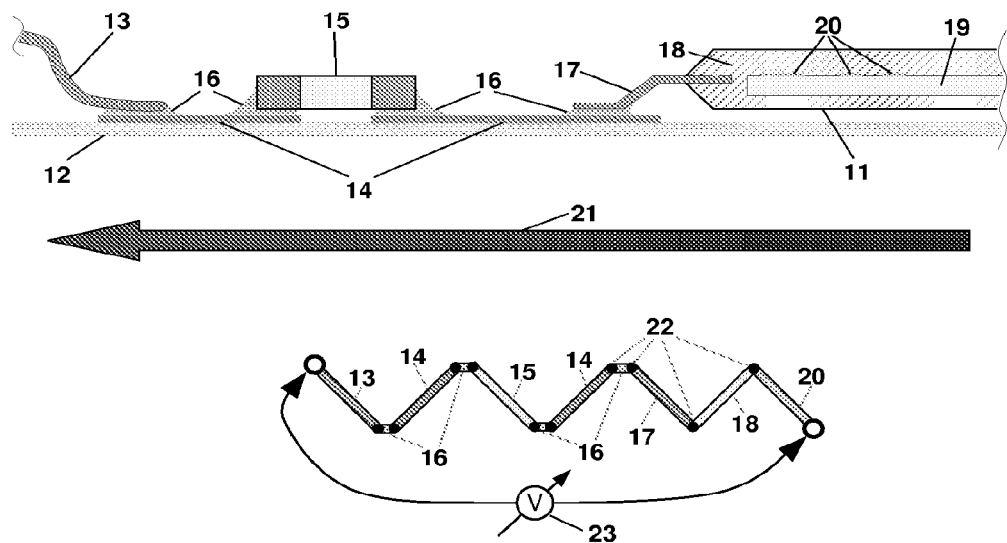
FIG. 2 illustrates generation of voltage errors.
Figure 3:
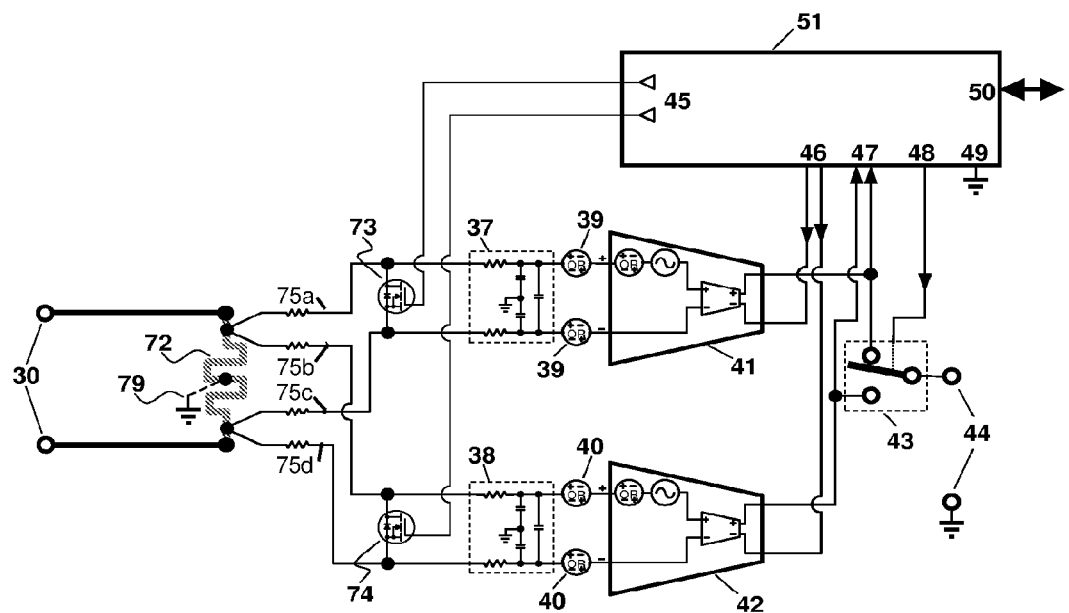
FIG. 3 describes one current measurement approach according to the invention.

One current sensor according to the invention is shown in FIG. 3. There is a current shunt 72 providing a voltage signal proportional to the current flowing in the shunt 72 to resistors 75*a*-75*d*, which are in turn connected to field effect transistor (FET) switches 73/74. Further, current sense signals pass via RFI filters 37 and 38, and then get amplified by instrumentation amplifiers (IAs) 41 and 42. An analog selector switch 43 delivers the signal to output terminals 44; this signal can be either the output from IA 41, or IA 42.

Figure 4:
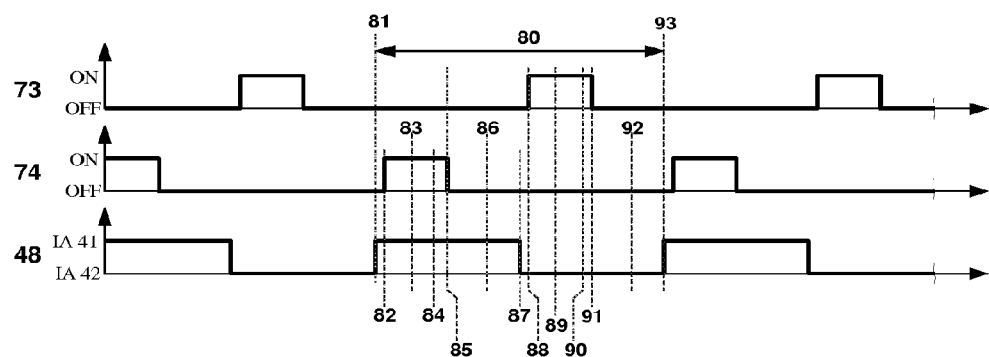
FIG. 4 shows the algorithm for activations of FETs 73/74 and Mux 48 signal in FIG. 3.

Under control of the circuit 51, and via FET Drivers 45, the FETs 73/74 are turned either fully on or off, as required for the execution of the Algorithm detailed in FIG. 4.

The action of FETs 73/74 can short-circuit the signal voltage input to RFI filters 37/38; offset voltage errors associated with the RFI filters and the whole amplification chain 37/39/41 or 38/40/42 can then be calibrated out.

At any point in time, there will be at least a single FET turned off from the pair 73/74.

Also, at any moment in time, there is at least a single RFI filter and an amplifier that provides output to the Output Terminals, via IA 41 or 42.

When it is desired to measure the voltage sensing error, the current sense signal is removed from one of the measurement channels by activation of the shunt FET (e.g. 73 or 74); the current sense signal is reduced in proportion to the ratio of resistors 75a-75d and on-resistance (so-called Rds-on) of the switches 73/74.

When current sense signal is removed from one of the measurement channels, the un-energized channel (via IA 41 or IA 42) measures the voltage errors, and Control Circuit 51 adjusts the output of Digital-to-Analog (D/A) converter 46, until the output of the channel being calibrated is equal to zero.

It will be appreciated that if continuous analog output signal is not required, and the only output from the current sensor circuit will be via the digital communication interface 50, then analog switch 43 as well as D/A 46 are not required, and removal of the voltage error can be done entirely in digital circuitry inside of the control circuit 51, by simply subtracting the measured error from the total signal measured by the analog-to-digital (A/D) converters 47.

The operations described above with respect to shunting the current sense (voltage) signal almost at the source differ greatly from the typical prior-art approach of reducing the voltage errors by auto zeroing the voltage offsets inside of the amplification chain; the prior-art approach cannot remove the errors associated with components located between the sense points and the inputs of the amplifier. Also, the prior-art approach is not able to compensate the errors resulting from lead-to-die bonding inside of the solid-state integrated circuits.

However, due to a much-simplified switch matrix (as compared to one previous circuit) the errors linked with Kelvin-sensing connections of the leads of the current shunt 72, as well as error voltages associated with resistors 75a-75d and switches 73/74 are not automatically compensated for.

On the other hand, there are only two MOSFET switches (as opposed to four in one previous circuit), and these switches 73 and 74 can be much smaller, and are only required to be able to carry a very small current, and thus are much less expensive than the units described in one previous circuit. The on resistance (Rds-on) parameter of switches 73 and 74 can be tailored to the values of resistors 75a-75d, and indeed the ratio between the resistances of resistors 75a-75d and Rds-on for the switches 73/74 define the ultimate accuracy and dynamic range of the circuit.

Figure 5:
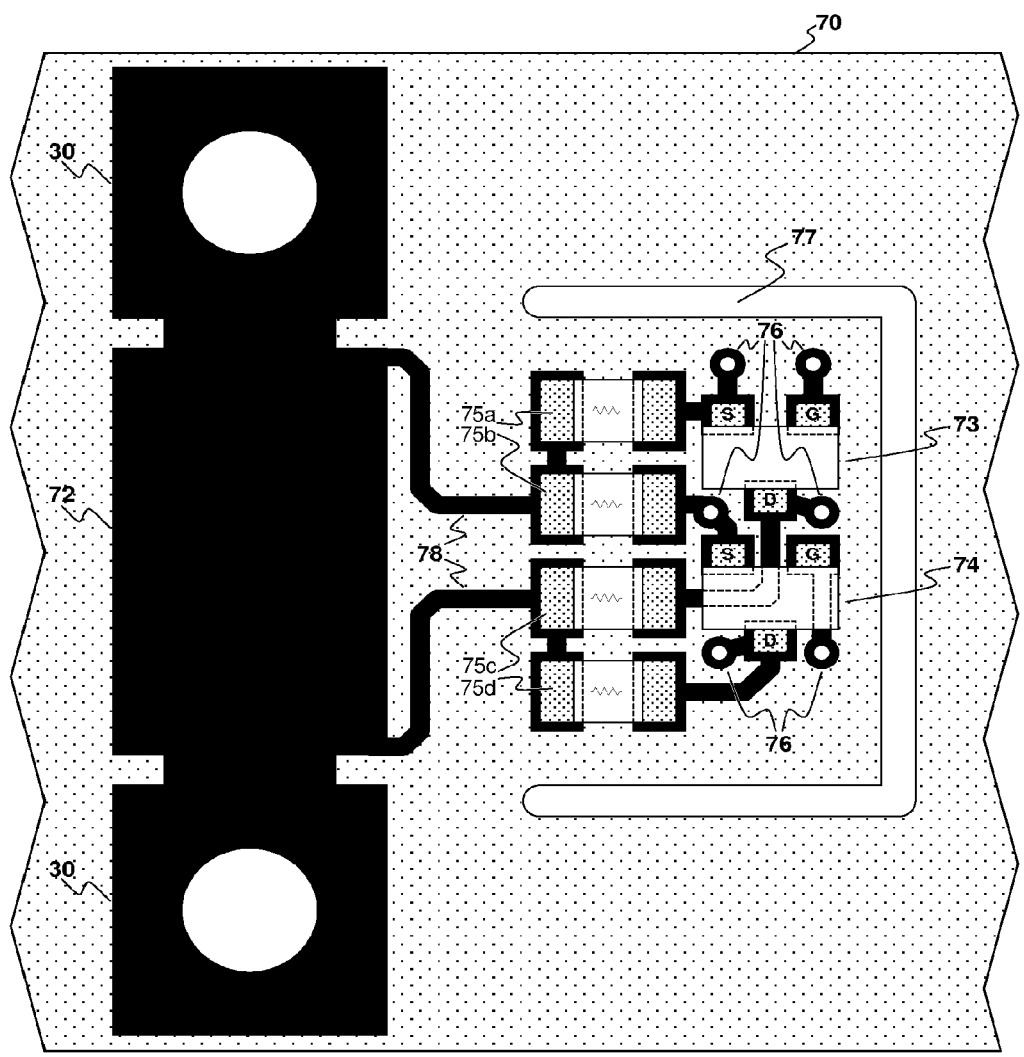
FIG. 5 presents a physical implementation that reduces uncompensated errors, FIG. 6 demonstrates an alternative embodiment with two RFI filters in each channel.

In order to reduce the uncompensated errors associated with resistors 75a-75d and switches 73/74, a specific physical construction is utilized, as presented in FIG. 5.

Current shunt 72 (FIG. 5) is constructed from copper utilizing common Printed Circuit Board (PCB) techniques. This current shunt does not have explicit sensing leads; sense lines 78 going to resistors 75a-75d are continuous in respect to the body of the current shunt 72.

In other words, there is no junction of dissimilar materials between the sensing leads on the current shunt and copper traces connecting to the rest of the circuit, thus no thermoelectric voltages can be generated.

The substrate of this PCB 70 may be a standard material called FR-4, or any other suitable for the required operating temperature range.

Components 75a-75d, 73, and 74 are closely grouped together in a small area of the PCB adjacent to the current shunt 72.

Metallization on the leads of resistors 75a-75d and switches 73/74 in combination with copper traces on the PCB (and with interloping solder) indeed create pairs of dissimilar materials that can lead to generation of thermo-electric error voltages; however, if the temperature of all such pairs of dissimilar materials is the same, then the resulting error voltages are very small or zero.

Furthermore, even if there is some temperature misbalance within the grouped components 75a-75d, 73, and 74, the thermoelectric voltage across each of two resistors 75a-75d that are connected to the same MOSFET switch 73 or 74 will have the alike value, and will cancel each other due to the differential-sensing circuit that follows it.

Moreover, a slot (air gap) 77 is cut into the PCB; this prevents the heat flux from escaping the area of the grouped components through heat conduction via the PCB substrate, effectively enforcing the same temperature across the whole area of the grouped components 75a-75d, 73, and 74.

A careful observer will recognize that all interconnections between grouped components 75a-75d, 73, and 74 are made with traces that are located on the same side of the PCB, without intervening vias (copperplated holes that connect traces on different layer of PCB, e.g. top and bottom). This prevents errors (thermoelectric and, possibly, electro-mechanical) that can result from particular methods of construction of the vias, which vary widely between PCB manufacturers.

On the other hand, the connections to the rest of the circuit are made through vias 76. While these connections to the rest of the circuit will pass through the areas with uneven temperatures and will indeed produce thermoelectric error voltages, their effects will be totally negated by the calibration action of the circuit.

Going back to FIG. 3, the two amplification channels are present in order to allow a single channel to provide the continuous readout of the current, while the other channel is calibrated. Calibration is performed when the current sense signal has been short-circuited by one of the MOSFET switches 73 or 74, and RFI filter 37 or 38 with corresponding IA 41 or 42 have settled to a final value that represents zero value of measured current; then auto zeroing action is executed by Control Circuit 51 (e.g. adjustment of the D/A to null-out the output of the appropriate IA 41 or 42). Once calibration is finished, the inactive channel is switched back into service, by opening one of the MOSFET switches 73 or 74. After RFI filter 37 or 38 have settled to a new value that is representative of the current being measured, the Analog Switch 43 is used to switch the Output terminals 44 to this newly calibrated channel. Thus, there are times in this circuit when both channels have output representative of the current being measured. During such times, the Control Circuit 51 can cross correlate the two signals; total accuracy of the Current Sensor can be improved by averaging the two values, and problems with the circuit can be discovered and reported if the readings from two channels start to diverge.

The user may elect to connect the local circuit's common potential (e.g. ground) to the middle of the current shunt 72 through the connection 79. This will give an improved performance for the RFI filters due to symmetrical differential nature of the RFI filters and the following circuit. Furthermore, the ground connection 79 to the shunt provides a reference voltage defining a fixed level at the sources of the MOSFETs 73, 74. This permits the system designer to select the output voltage at drivers 45 to fully turn the MOSFETs 73, 74 on or off.

It may be instructive to say a little more about the resistors 75a-75d. The value of these resistors cannot be permitted to be too large because mismatch in the bias current of the AI will create systematic offset error due to I*R losses. By way of perspective, a 1 nA bias mismatch (which is a possible value for an IA) across a 100 Ohm resistor will create an offset of 100 n V.

On the other hand, the same sorts of errors from resistors in block 37 do not affect the output of an IA, since those errors are "after" the MOSFETs 73, 74 in the signal path, and these errors are zeroed by the calibration/autozero action. This permits the resistors in block 37 to have relatively high values if desired. This may be helpful for example if it is desired to use reasonably small capacitors in the block 37 while nonetheless achieving meaningful time constants in the filters.

Returning to resistors 75a-75d, while it would be a problem if the resistors were too large in value, it is also the case that resistors 75a-75d cannot be permitted to be too small, since we want to attenuate the signal across shunt 72 as much as possible when autozero is being performed. In other words—the ratio between the value of resistors 75a-75d and the "on" resistance of MOSFETs 73, 74 should be as high as possible. So consider for example the use of 100-Ohm resistors 75a-75d, with MOSFETs 73, 74 that have 10 milliOhms on resistance (which is quite low). In this example, the largest error coming from this noninfinite attenuation when a MOSFET is on is on the order of a full-scale signal divided by 10 k, or only 80 dB of signal-to-noise.

The circuit's operating algorithm will now be described referring to FIG. 4.

An arbitrarily selected point in time 81 is chosen as the beginning of the algorithmic cycle; at this time both MOSFET switches 73 and 74 are off, and both channels are providing the current signal; however Mux 48 signal has just selected the output of IA 41 to be passed to output terminals 44.

At point 82 the switch 74 is turned on, and the current sense signal (voltage) at RFI filter 38 is short-circuited by MOSFET switch 74. The voltage at the input terminals of IA 42 should be exactly zero; however, due to previously described effects, the voltage at the input terminals of IA 42, after passage through the sense connections and RFI filter 38, contains some systematic offset error (mostly due to thermoelectric voltages generated at junctions of dissimilar materials having different temperatures). At point 82 the RFI filter 38 starts to settle toward the final stable value.

At point 83 the RFI filter 38 has finished settling and provides a stable value to the IA 42; the output voltage of IA 42 is sampled by one of the channels of A/D 47 and/or one of the D/A 46 outputs is changed until output from IA 42 is equal to zero.

At point 84 the calibration for this channel 74/38/40/42 is finished.

At points 85 the MOSFET switch 74 is opened.

At point 86 the RFI filter 38 has fully settled to the value representative of the current flowing in shunt 72.

Finally at 87 the output is switched to the newly calibrated channel 74/38/40/42 by changing the state of signal Mux 48; now the output terminals 44 are connected to the output of IA 42.

Note that for the duration of the calibration of the measurement channel related to closed switch 74, the channel related to open switch 73 supplied the output signal.

At points 87 through 93 exactly the same procedure as described above, from point 81 to point 87, is applied to the measurement channel 73/37/39/41, with actions applied to MOSFET 73 and Mux 48.

Finally, a new algorithmic cycle starts at point 93.

It will be appreciated that at the very beginning of the operations (when the power is first applied to the whole circuit), a slightly different cadence could be utilized in order to acquire the initial values of the offset errors; then the complete cycle 80 repeats indefinitely. However the duration of the complete calibrate/measure/settle/switchover cycle 80 can be adjusted, depending on the rate of change of the temperature and/or temperature gradients over the circuit. If it is desired to adjust this cycle, for example to reduce the amount of time spent in calibration and zeroing activity, then the temperature should be sensed with a suitable sensor or sensors. Such sensors are omitted for clarity in FIG. 3.

It will likewise be appreciated that if the amount of time spent in calibration and zeroing is reduced, this makes it possible for some periods of time when both signal processing channels are in measurement service. This permits cross-correlating the two measured signals (at A/D 47), whether for purposes of averaging or for purposes of early warning of possible failure in one of the two channels.

In addition, temperature measurements will be used to compensate for the temperature dependency of the resistance of the current shunt 72. For example, in a physical embodiment as shown in FIG. 5, the current shunt is created with a copper pattern on a PCB (and thus avoids the necessity to procure and assemble separate discrete components); in this case the dependency of the copper used for the conductive tracks on the PCB would be well known and predictable, and the resistance value changes could be readily compensated by digital calculations in the control circuit 51. If required, the continuous analog output at output terminals 44 can also be adjusted to compensate for the current shunt's resistance changes; however, the main application of the continuous analog output is to provide the fast electronic solid state fuse capability which may not require very high precision, and may well be served sufficiently with a value that has not been compensated for resistance changes with temperature. Nevertheless, the circuit required for the adjustment of the continuous analog output will involve utilization of programmable-gain functionality in IA 41 or 42; this will be familiar to the reader.

Likewise, the initial full-scale error created by an inaccurate value (due to manufacturing tolerances) of the shunt 72 at room temperature, may be calibrated out by passing an accurately known current through the shunt 72, and recording (preferably in the local non-volatile memory) an appropriate value for the digital adjustment of gain for the whole current sensor system.

The current invention provides sufficient and arbitrarily long time for settling of the RFI filters 37 and 38, and is able to accommodate filters with extremely long time constants. This is beneficial for the accuracy of the measurements when output of the current sensor is used for accumulation of the total charge passed through the input terminals 30 (e.g. Coulomb counting). If such an integrated current value is maintained and calculated in the digital part of the circuit, an increase in the time constant of the RFI filter can be taken advantage of for lowering of the required sampling rate of the A/D converters 47 (FIG. 3).

However, in this case, the fast response time of the (analog) output, used for solid-state fuse functionality, will be compromised.

Figure 6:
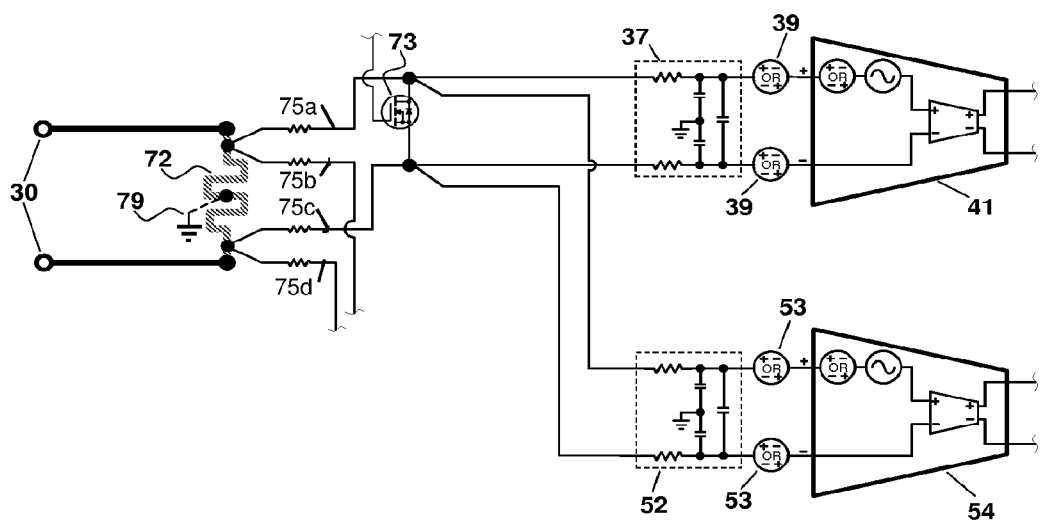

A solution for this problem according to the current invention is disclosed in FIG. 6. This drawing shows one channel of measurements that contains two RFI filters 37 and 52, and two corresponding amplifiers 41 and 54; all of these are associated with switch 73. The other channel (related to switch 74) is not shown for clarity of the drawing; nonetheless, it also contains two RFI filters and two instrumentation amplifiers. The output of the IA 41 is connected to the output terminals 44 via Switch 43 (as shown in FIG. 3); RFI filter 37 has a time constant that is appropriate for the solid-state fuse functionality. On the other hand, the output of the IA 54 is only connected to the additional A/D input at the control circuit 51, the value on the output of IA 54 will only be reported in digital form after processing in the control circuit 51, and it does not require the offset-compensation D/A (as the calibration value would be subtracted digitally). In this signal processing channel, the RFI filter 52 has a time constant that is suitable for the measurements of the charge passing through the current shunt 72, while utilizing a slow sampling rate of the A/D. RFI filter 52 has a time constant that is many times longer than the time constant of RFI filter 37. The timing of the operating algorithm (as illustrated in FIG. 4) is thus set to properly service the timing requirements of the RFI filter 52 (since RFI filter 37 has a shorter time constant, its settling time requirements will certainly be satisfied).

As mentioned above, in this embodiment exactly the same circuit is constructed after switch 74, with two RFI filters and two instrumentation amplifiers. An IA that is associated with a fast RFI filter can be connected to output terminals 44 via switch 43, while the output of other IA is connected only to an additional A/D input of the control circuit 51.

Accordingly, the embodiment disclosed in FIG. 6 can be used simultaneously for fast electronic solid state fuse functionality via a continuous analog output, and for precise measurements of the accumulated charge that is reported digitally by control circuit 51.

It might be asked whether the same functionality (serving both the fast-fuse need and the need for very accurate measurement) could be achieved by providing a fast RFI filter, followed by an IA, and then followed by another filter that is suitable for reduction of the A/D sampling rate, as is typical of older circuits. It turns out that this does not work well, and that it really is better to provide the fast and slow signal processing paths in parallel as shown in FIG. 6. To understand why this does not work well, consider that if the current is to be measured accurately, the fast transients of the measured current would need to be faithfully reproduced and amplified by the first 1A, and from this amplified result, the bandwidth of the signal would need to be reduced by the second (slow) filter. But if there is any nonlinearity in that first instrumentation amplifier, with such nonlinearity exacerbated by possibly quickly changing signals, then this could create clipping and could generally disturb the otherwise intended linear operations of the IA. Such clipping and nonlinearity would have a profound effect on the accuracy of the measurements.

By comparison, the approach shown in FIG. 6 has a "slow" signal processing path that maintains accuracy and is not dependent upon any requirement of high performance by the "fast" signal processing path. In the approach shown in FIG. 6, so far as the accurate but slow path is concerned, the circuit firstly limits the bandwidth with a "slow" filter 52 (utilizing simple passive components for the filter 52 that are naturally highly linear even in the presence of transients). Then the output of the "slow" filter 52 is amplified by IA 54. It is noted that IA 54 can thus be a relatively low-bandwidth unit, with correspondingly very low power consumption.

It will be recognized that the control circuit 51 will be best served by the use of a microprocessor; the whole circuit 51 can in fact be contained in a single-chip microcontroller that also includes the required functionality of A/D 47, D/A 46, communication interface 50, and port pins that will serve as Mux signal 48 and FET Drivers 45. The instrumentation amplifiers can reside on the same chip for a compact and inexpensive solution.

Figure 7:
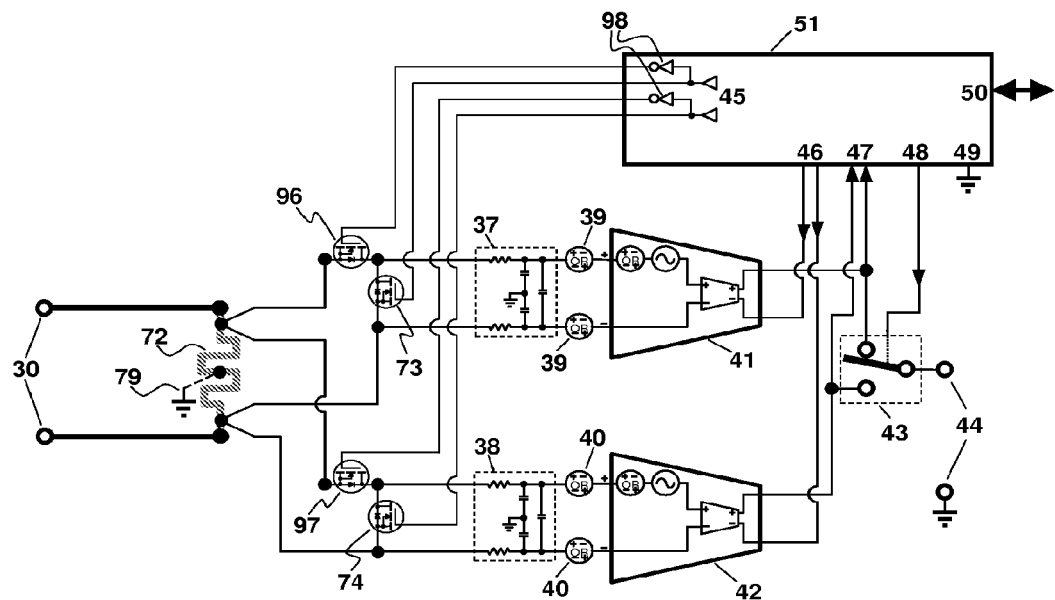
FIG. 7 shows the apparatus in a second embodiment according to the invention, with a single shunt and a two-FET switching circuit.
Figure 8:
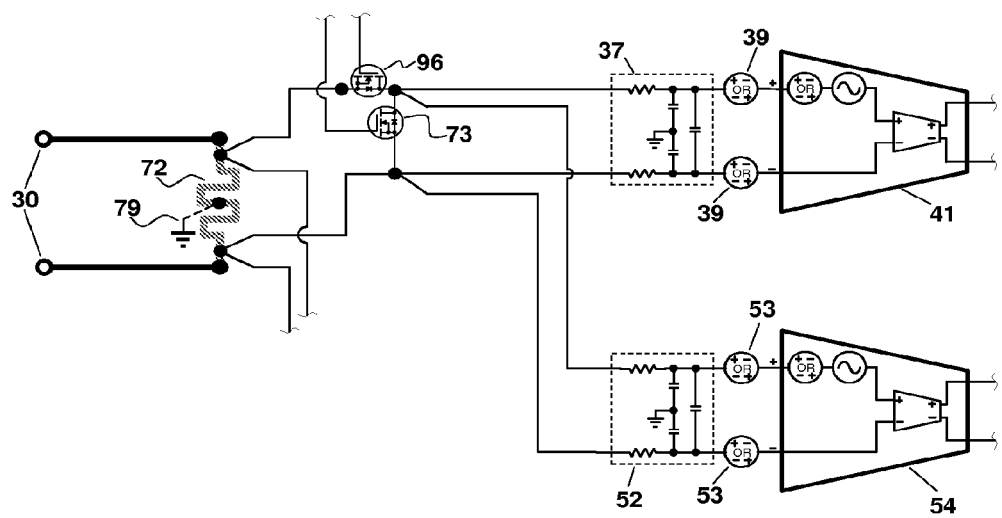
FIG. 8 shows an alternative embodiment according to the invention, with a two-FET switching circuit and two RFI filters in each channel.

Alternate circuits are shown in FIG. 7 and FIG. 8. These circuits replace the resistors 75a-75d of FIG. 3, FIG. 5 and FIG. 6 with FETs 96/97. Depending on exact implementation details and requirements, the circuits in FIG. 7 and FIG. 8 may have advantages over the circuits in FIG. 3 and FIG. 6, and vice versa.

The alert reader will have no difficulty devising myriad obvious variations and improvements upon the invention, after having appreciated the teachings herein. It is intended that the claims which follow will embrace such variations and improvements.

The alert reader will appreciate that what has been described is at least two ways in which the first and second measurement points could be connected with the first and second input terminals of the first instrumentation amplifier, which ways could be termed an impedance means. One way that the impedance means could be accomplished is by arranging for impedance means to comprise a first resistor connecting the first measurement point with the first input terminal of the first instrumentation amplifier and a second resistor connecting the second measurement point with the second input terminal of the first instrumentation amplifier. Another way that the impedance means could be accomplished is by arranging for impedance means to comprise a third switch connecting the first measurement point with the first input terminal of the first instrumentation amplifier and an electrical connection connecting the second measurement point with the second input terminal of the first instrumentation amplifier.

The same could be said for a second impedance means connecting the first and second measurement points to the first and second input terminals of the second instrumentation amplifier. Such an impedance means could for example be accomplished by such resistors or by such switches and electrical connections.

The invention claimed is:

1. Apparatus for use in measuring current with respect to first and second measurement points, the apparatus comprising:
   a first instrumentation amplifier, said instrumentation amplifier having first and second input terminals,
   a first impedance means connecting the first and second measurement points to first and second terminals of a first switch, respectively, with the first and second terminals of the first switch connected respectively to the first and second input terminals of the first instrumentation amplifier;
   a second instrumentation amplifier, said instrumentation amplifier having first and second input terminals,
   a second impedance means connecting the first and second measurement points to first and second terminals of a second switch, respectively, with the first and second terminals of the second switch connected respectively to the first and second input terminals of the second instrumentation amplifier.

2. The apparatus of claim 1 further comprising a shunt with first and second terminals, the current disposed to pass between said first and second terminals, the shunt having the first and second measurement points disposed therebetween.

3. The apparatus of claim 1 wherein
   the first impedance means comprises a first resistor connecting the first measurement point with the first input terminal of the first instrumentation amplifier and a second resistor connecting the second measurement point with the second input terminal of the first instrumentation amplifier, and wherein the second impedance means comprises a third resistor connecting the first measurement point with the first input terminal of the second instrumentation amplifier and a fourth resistor connecting the second measurement point with the second input terminal of the second instrumentation amplifier.

4. The apparatus of claim 1 wherein
the first impedance means comprises a third switch connecting the first measurement point with the first input terminal of the first instrumentation amplifier and an electrical connection connecting the second measurement point with the second input terminal of the first instrumentation amplifier, and wherein
the second impedance means comprises a fourth switch connecting the first measurement point with the first input terminal of the second instrumentation amplifier and an electrical connection connecting the second measurement point with the second input terminal of the second instrumentation amplifier.

5. The apparatus of claim 3 further comprising a control means,
the control means disposed at times to open the first switch and close the second switch, and to zero any offset in the second instrumentation amplifier, while providing current-measurement information from the first instrumentation amplifier to equipment external to the apparatus;
the control means disposed at other times to close the first switch and open the second switch, and to zero any offset in the first instrumentation amplifier, while providing current-measurement information from the second instrumentation amplifier to equipment external to the apparatus.

6. The apparatus of claim 4 further comprising a control means,
the control means disposed at times to close the third switch and open the first switch and open the fourth switch and close the second switch, and to zero any offset in the second instrumentation amplifier, while providing current-measurement information from the first instrumentation amplifier to equipment external to the apparatus;
the control means disposed at other times to open the third switch and close the first switch and close the fourth switch and open the second switch, and to zero any offset in the first instrumentation amplifier, while providing current-measurement information from the second instrumentation amplifier to equipment external to the apparatus.

7. The apparatus of claim 4 wherein
the shunt, the first and second terminals thereof, and the first and second measurement points thereof, are formed on a printed circuitry board, and wherein
first, second, and third respective soldering pads for each of the first, second, third and fourth switches are formed on the printed circuitry board, and wherein
the shunt, the first and second terminals thereof, and the first and second measurement points thereof, and the first respective soldering pad for each of the first, second, third, and fourth switches are all fabricated of a single continuous extent of copper cladding.

8. The apparatus of claim 7 wherein the first, second, third and fourth switches are closely grouped together in a small area of the printed circuitry board, adjacent to the shunt.

9. The apparatus of claim 8 wherein an air gap is cut into the printed circuitry board around the first, second, third and fourth switches, whereby the first, second, third and fourth switches tend toward the same temperature.

10. The apparatus of claim 5 wherein zeroing of an offset in a instrumentation amplifier is achieved by applying an analog offset to an output terminal thereof.

11. The apparatus of claim 5 wherein zeroing of an offset in a instrumentation amplifier is achieved by digital computation applied to a digitized output therefrom.

12. The apparatus of claim 6 wherein zeroing of an offset in a instrumentation amplifier is achieved by applying an analog offset to an output terminal thereof.

13. The apparatus of claim 6 wherein zeroing of an offset in a instrumentation amplifier is achieved by digital computation applied to a digitized output therefrom.

14. A current measurement system for use with apparatus comprising a shunt having first and second measurement points, the apparatus having first and second instrumentation amplifiers, each having a respective first input terminal and a respective second input terminal, the apparatus having first and second switches controllably connecting the respective first input terminal and the respective second input terminal of the first and second instrumentation amplifiers, the apparatus having a controller configured to turn either of the first and second switches fully on or off, with at least one of the first and second switches turned off at any point in time, each of the first and second instrumentation amplifiers having an output indicative of measured voltage, the method comprising the steps of:
for a first interval, connecting the first input terminal of the first instrumentation amplifier to the first measurement point and connecting the second input terminal of the first instrumentation amplifier to the second measurement point;
during the first interval, providing current-measurement information from the first instrumentation amplifier to equipment external to the apparatus;
within the first interval, connecting the first input terminal of the second instrumentation amplifier to the second input terminal of the second instrumentation amplifier, and zeroing any offset in the second instrumentation amplifier;
for a second interval, connecting the first input terminal of the second instrumentation amplifier to the first measurement point and connecting the second input terminal of the second instrumentation amplifier to the second measurement point;
during the second interval, providing current-measurement information from the second instrumentation amplifier to equipment external to the apparatus;
within the second interval, connecting the first input terminal of the first instrumentation amplifier to the second input terminal of the first instrumentation amplifier, and zeroing any offset in the first instrumentation amplifier,
wherein the apparatus further comprises third and fourth instrumentation amplifiers, each having a respective first input terminal and a respective second input terminal, each of the third and fourth instrumentation amplifiers having an output indicative of measured voltage, the method further characterized in that:
for the first interval, connecting the first input terminal of the third instrumentation amplifier to the first measurement point and connecting the second input terminal of the third instrumentation amplifier to the second measurement point;

during the first interval, providing current-measurement information from the third instrumentation amplifier to equipment external to the apparatus;

within the first interval, connecting the first input terminal of the fourth instrumentation amplifier to the second input terminal of the fourth instrumentation amplifier, and zeroing any offset in the fourth instrumentation amplifier;

for a second interval, connecting the first input terminal of the fourth instrumentation amplifier to the first measurement point and connecting the second input terminal of the fourth instrumentation amplifier to the second measurement point;

during the second interval, providing current-measurement information from the fourth instrumentation amplifier to equipment external to the apparatus;

within the second interval, connecting the first input terminal of the third instrumentation amplifier to the second input terminal of the third instrumentation amplifier, and zeroing any offset in the third instrumentation amplifier.

15. The method of claim 14 wherein the first interval and second interval alternate continuously, whereby current-measurement information from one or another of the instrumentation amplifiers is continuously provided to equipment external to the apparatus.

16. The method of claim 14 further comprising a step, carried out within the second interval, of connecting the first input terminal of the first instrumentation amplifier to the first measurement point and connecting the second input terminal of the first instrumentation amplifier to the second measurement point, and comparing current-measurement information from the first instrumentation amplifier with current-measurement information from the second instrumentation amplifier.

17. The method of claim 15, further comprising integrating the current-measurement information over a period of time to measure total charge passing through the shunt during that period of time.

18. The method of claim 15, further comprising acting upon the current-measurement information to open an electronic fuse, ceasing current through the shunt.

19. The method of claim 14 wherein zeroing of an offset in a instrumentation amplifier is achieved by applying an analog offset to an output terminal thereof.

20. The method of claim 14 wherein zeroing of an offset in a instrumentation amplifier is achieved by digital computation applied to a digitized output therefrom.

21. The method of claim 14 further comprising:

within the first interval, disconnecting at least one of the input terminals of the second instrumentation amplifier from at least one of the first and second measurement points; and within the second interval, disconnecting at least one of the input terminals of the first instrumentation amplifier from at least one of the first and second measurement points.

* * * * *